United States Patent

Hwang

[19]

[11] Patent Number: 5,886,546
[45] Date of Patent: Mar. 23, 1999

US005886546A

[54] CURRENT/VOLTAGE CONVERTER, SENSE AMPLIFIER AND SENSING METHOD USING SAME

[75] Inventor: Tae-Sun Hwang, Choongcheongbuk-Do, Rep. of Korea

[73] Assignee: LG Semicon Co., Ltd., Cheongju, Rep. of Korea

[21] Appl. No.: 881,591

[22] Filed: Jun. 24, 1997

[30] Foreign Application Priority Data

Jun. 27, 1996 [KR] Rep. of Korea ............... 24470/1996

[51] Int. Cl.$^6$ ............................. H02M 11/00; G11C 7/06
[52] U.S. Cl. .................................. 327/103; 327/53
[58] Field of Search .......................... 327/52, 53, 56, 327/51, 103; 365/185.18, 185.21; 363/73; 323/315

[56] References Cited

U.S. PATENT DOCUMENTS

| 4,740,743 | 4/1988 | Reisinger et al. ................. 327/103 |
| 4,943,737 | 7/1990 | Guo et al. ........................... 323/315 |
| 5,206,552 | 4/1993 | Iwashita ............................... 327/53 |
| 5,255,233 | 10/1993 | Izumi ................................. 365/207 |
| 5,481,179 | 1/1996 | Keeth ................................. 323/315 |
| 5,528,543 | 6/1996 | Stiegler ............................. 365/207 |

*Primary Examiner*—Toan Tran
*Attorney, Agent, or Firm*—Fleshner & Kim

[57] ABSTRACT

A sense amplifier and method are provided using current/voltage converters that are suitable for a multibit (2 bit/cell) memory device. The sense amplifier includes first and second current/voltage converters and a voltage comparator. The current/voltage converters each include a current mirror amplification unit to amplify an input current and a current mirror conversion unit to convert the amplified current into a voltage. A current to be sensed is applied to the first current/voltage converter and a reference current is applied to the second current/voltage converter. The voltage comparator determines a voltage difference by comparing the voltage output by the first and second current/voltage converters. The sense amplifier and method increases the speed and ease of sensing the input current. Further, the sense amplifier and method applied to a multibit memory can reduce an area for memory elements by 40%.

24 Claims, 5 Drawing Sheets

CURRENT/VOLTAGE CONVERTER, SENSE AMPLIFIER AND SENSING METHOD USING SAME

BACKGROUND OF THE INVENTION

1. Field of the Invention

The present invention relates to a sense amplifier and method, and more particularly, to a current/voltage converter of a sense amplifier.

2. Background of the Related Art

A related art sense amplifier includes a current/voltage converter and a differential amplifier. The differential amplifier, which is used mostly in the input stage, can alternatively be replaced by a voltage comparater. Thus, a sense amplifier generally performs the function of detecting the unamplified voltage level or the unamplified current level of input signals exceeding a threshold value in the current/voltage converter, and then amplifying and outputting the detected signals in the differential amplifier or the voltage comparator. The sense amplifier detects the input signals only in a specified time domain. Such sense amplifiers are used for sensing and amplifying the very small output signals of memory devices, etc.

As shown in FIG. 1, the related art sense amplifier includes a first current/voltage converter 10 to convert a current applied through a bit line of a memory cell (not illustrated) into a voltage. A second current/voltage converter 20 converts a reference current received from an external transistor (not illustrated) into a voltage, and a voltage comparator 30 compares the voltages converted by the first current voltage converter 10 and the second current/voltage converter 20. The first current/voltage converter 10 has a PMOS transistor P1 with its gate and drain coupled together, and with the power supply voltage $V_{cc}$ applied to its source. Further, an NMOS transistor N1 has the drain of the PMOS transistor P1 is coupled to its source, the bit line coupled to its drain, and its gate coupled to the bit line through an inverter INV1.

The second current/voltage converter 20 has a PMOS transistor P2 with its gate and drain coupled to each other and with the power supply voltage $V_{cc}$ applied to its source. Further, an NMOS transistor N2 has the drain of the PMOS transistor P2 coupled to its source, an external random reference current coupled to its drain, and the reference current coupled to its gate through an inverter INV2.

The operation of the related art sense amplifier including the first and second current/voltage converters 10, 20 is as follows. First, when a low-level signal is applied to the inverter INV1 of the first current/voltage converter 10 through the bit line of the memory cell (not illustrated), the low-level signal is inverted by the inverter INV1 and applied to the gate of the NMOS transistor N1.

Accordingly, as the NMOS transistor N1 is turned ON and the low-level signal is applied to the gate and the drain of the PMOS transistor P1, the PMOS transistor P1 is turned ON and the node A becomes low-level. The node A becomes low level because a current sink is created when the current at the node A discharges through the turned ON NMOS transistor N1.

When, a high-level signal is applied to the inverter INV1 of the current/voltage converter 10, the high-level signal is inverted and applied to the gate of the NMOS transistor N1. Consequently, the NMOS transistor N1 is turned OFF. At that time, a specified bias voltage of about 4 V is applied to the node A and the gate of the PMOS transistor P1. Thus, the PMOS transistor P1 is turned ON. Accordingly, the power supply voltage $V_{cc}$ is applied to the node A, which transitions to a complete high level state.

The second current/voltage converter 20 is operated in the same way as the first current/voltage converter 10. The voltage comparator 30 compares and outputs the voltage difference between the node A of the first current/voltage converter 10 and node B of the second current/voltage converter 20.

The NMOS transistor N1 with the inverter INV1, and the NMOS transistor N2 with the inverter INV2 maintain the bias level of the inputs at a specified level. The PMOS transistors P1, P2 function as active loads. The current/voltage converters may also include various pulse signal generators depending on the user's requirements.

The operation of the related art sense amplifier will further be described by an example. When the input current is 20 μA and the reference current is 10 μA, the current flowing through the PMOS transistor P1 is 20 μA because there is no amplification of the input current. Since the PMOS transistors P1, P2 function as active loads, however, they have a resistance value. If the resistance value is 30 kΩ for the PMOS transistors P1, P2, the voltage drop is 30 kΩ×20 μA=0.6 V. In the second current/voltage converter 20, the first current/voltage converter 10 voltage drop is 30 kΩ×10 μA=0.3 V. Accordingly, voltages of 4.4 V and 4.7 V are applied to the node A and to the node B, respectively. Therefore, the voltage comparator 30 compares and outputs the voltage difference between the nodes A and B.

FIG. 2 is a graph of the change in the voltage over time on the node A, which is an output point of the first current/voltage converter 10. A simulation was performed by coupling various MOS transistors having threshold voltages of 0.7 V, 1.5 V, 2.2 V and 4 V as the threshold voltages of the memory cells to the input of the first current/voltage converter 10. When the nanometer channel W/L (width/length) is 600/800 for a related art sense amplifier in the simulation, the voltage difference of the node A between memory cells of 0.7 V (3.312 V) and 4 V (3.779 V) is 0.467 V (3.779 V–3.312 V), as shown in FIG. 2.

When related art sense amplifiers are used with a multibit memory, the difference between the currents by the threshold voltage of the memory cells is small. Thus, even after the voltage is converted in the current/voltage converter of the sense amplifier, the difference between the converted voltages is small. Therefore, the related art sense amplifiers suffer the problem that it is difficult to make a comparison in the voltage comparator.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

It is another object of the present invention to provide current/voltage converter for amplifying an input current and converting the amplified current into a voltage.

It is yet another object of the present invention to provide a sense amplifier for amplifying an input current, converting the amplified current into a voltage, and then comparing and outputting the voltage difference between the converted voltage and another voltage.

It is a further object of the present invention to provide a sense amplifier that reduces the area of related art memory elements by 40% or more.

It is a further object of the present invention to provide a sense amplifier for multibit memory devices.

It is a further object of the present invention to provide a sensing method of amplifying a current applied to a voltage comparator, converting the amplified current into a voltage, and then comparing the voltage difference between the converted voltage and another voltage.

To perform at least the above objects, a current/voltage converter according to the present invention includes an amplifier unit to amplify an input current and a conversion unit to convert the amplified current into a voltage.

A sense amplifier according to the present invention includes a first current/voltage converter to amplify an input current and to convert the amplified current into a first voltage, a second current/voltage converter to amplify a reference current and to convert the amplified reference current into a second voltage, and a voltage comparator to compare the first and second voltages.

A method according to the present invention includes amplifying an input current and converting the amplified current into a first voltage amplifying a reference current and converting the amplified reference current into a second voltage and comparing the first and second voltages.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 3:
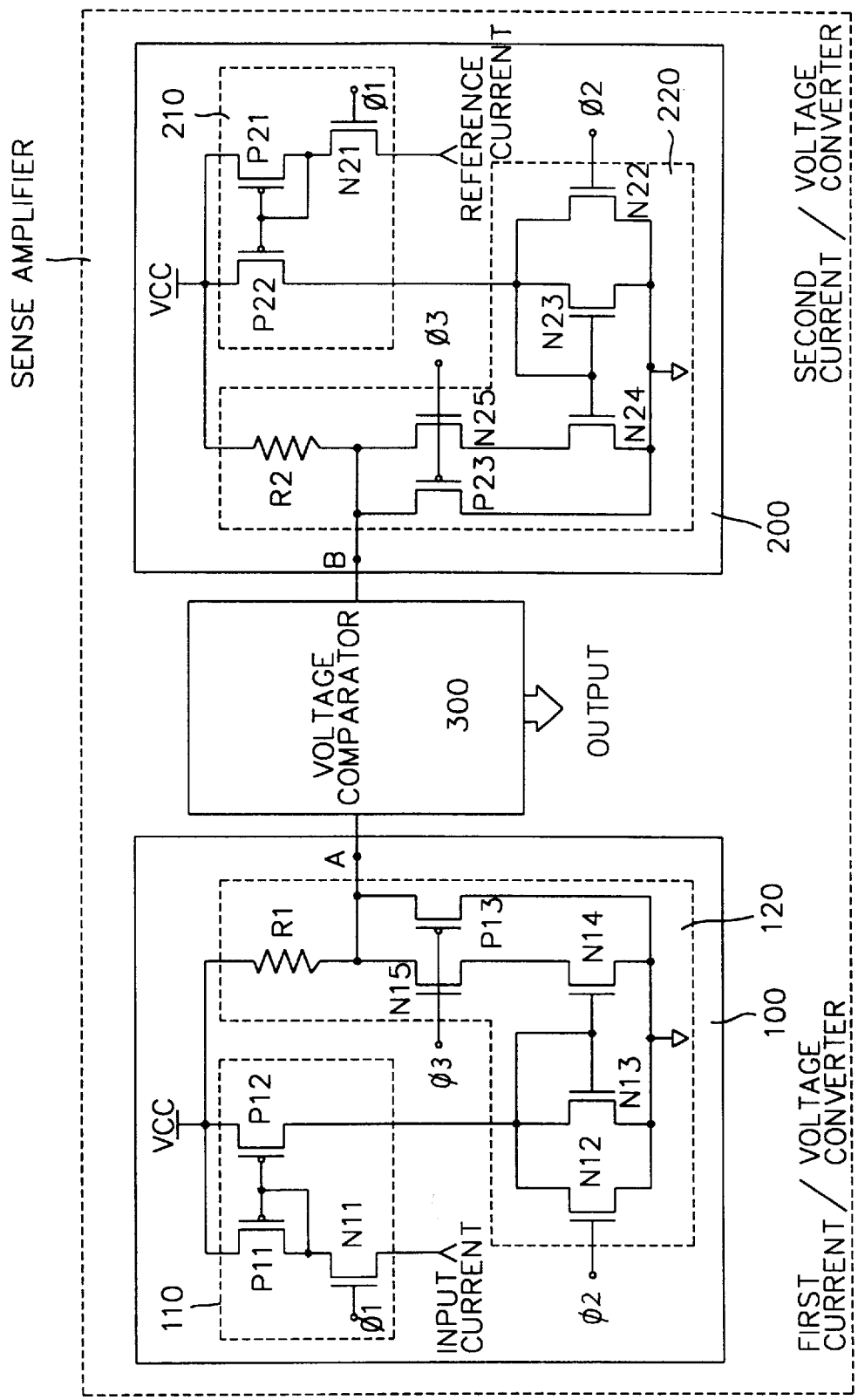
FIG. 3 is a diagram showing a circuit of a preferred embodiment of a sense amplifier according to the present invention.

A first preferred embodiment of a sense amplifier according to the present invention includes first and second current/voltage converters 100, 200. As shown in FIG. 3, the first current/voltage converter 100 includes an amplification unit 110 to amplify an input current from a memory cell (not illustrated), and a conversion unit 120 to convert the amplified current into a voltage.

The second current/voltage converter 200 includes an amplification unit 210 to amplify a reference current from an external current source (not illustrated) and a conversion unit 220 to convert the amplified reference current into a voltage.

The sense amplifier further includes a voltage comparator 300 to compare the voltages from the first and second current/voltage converters 100, 200.

The amplification unit 110 of the first current/voltage converter 100 includes a PMOS current mirror having an NMOS transistor N11 and a pair of PMOS transistors P11, P12. The conversion unit 120 includes an NMOS current mirror having an NMOS transistor N12 and a pair of NMOS transistors N13, N14, an NMOS transistor 15, a PMOS transistor P13, and a resistor R1.

In the amplification unit 110, the power supply voltage $V_{cc}$ is applied to the sources of the PMOS transistors P11, P12, the gates of which are coupled to each other, the drain of the PMOS transistor P11 and the source of the NMOS transistor N11. The input current from the bit line is applied to the drain of the NMOS transistor N11 and a pulse signal $100_1$ is applied to the gate of the NMOS transistor N11. The drain of the PMOS transistor P12 is coupled to the conversion unit 120.

In the conversion unit 120, a pulse signal $100_2$ is applied to the gate of the NMOS transistor N12 and the gates of the NMOS transistors N13, N14 are coupled to each other, the amplification unit 110 and the drain of the NMOS transistors N12. The sources of the NMOS transistors N12, N13, N14 are coupled to ground. A pulse signal $100_3$ is applied to the gates of the NMOS transistor N15 and the PMOS transistor P13. The source of the NMOS transistor N15 is coupled to the drain of the NMOS transistor N14, and the drain of the PMOS transistor P13 is grounded. The drain of the NMOS transistor N15 and the source of the PMOS transistor P13 are coupled to the voltage comparator 300 at a node A of the first current/voltage converter 100. The resistor R1 of the conversion unit 120 is coupled between the power supply voltage $V_{cc}$ and the drain of the NMOS transistor N15.

Construction of the second current/voltage converter 200 is similar to the first current/voltage converter 100, and therefore a detailed description is omitted. The operation of the amplification unit 110 and the conversion unit 120 are described in detail below.

First, in the amplification unit 110 when the pulse signal $100_1$ is applied to the gate of NMOS transistor N11, the PMOS current mirror formed by the PMOS transistors P11, P12 amplifies the input current from the memory cell (not illustrated). The NMOS current mirror formed by the NMOS transistors N13, N14 of the conversion unit 120 receives and outputs the amplified current when the pulse signal $100_2$ is applied to the gate of NMOS transistor N12. The output amplified current is converted into a voltage because of the resistor R1, and the power supply voltage $V_{cc}$ is dropped by passing through the resistor R1.

In the amplification unit 210 when the pulse signal $100_1$ is applied to the gate of NMOS transistor N21, the PMOS current mirror formed by transistors P21, P22 amplifies the reference current received from an external transistor or the like (not illustrated). The NMOS current mirror formed by the NMOS transistors N23, N24 receives and outputs the amplified reference current. The output amplified reference current is converted into a voltage because of the resistor R2.

The voltage comparator 300 compares the voltages output from the first and second current/voltage converters 100, 200, respectively.

Operations of the sense amplifier including the first and second current/voltage converters will now be described. First, a case where the bit line input is not read in the first current/voltage converter 100 will be described.

When a low-level pulse signal $100_1$ is applied to the gate of the NMOS transistor N11 in the first current/voltage converter 100, the NMOS transistor N11 is turned off. When any logic high external signals $100_2$ are then applied to the gate of the NMOS transistor N12, the NMOS transistor N12 is turned on and the power supply voltage $V_{cc}$ drains out through a path including the NMOS transistor N12. Thus, the node A in the first current/voltage converter 100 becomes low. Further, low-level signals are applied to the gates of the NMOS transistors N14, N15, and the NMOS transistors N14, N15 are turned off. While a low-level external signal $100_3$ is applied to the gates of the NMOS transistor N15 and the PMOS transistor P13, the NMOS transistor N12 is turned off and the PMOS transistor P13 is turned on.

Next, a case where the sense amplifier is operated to read the bit line input in the first current/voltage converter 100 will be described. In this case, the external signals $100_{1,2,3}$ have respective logic values opposite the above-described operation (no sensing) where the bit line input was not read by the first current/voltage converter 100.

When a logic high external signal $100_1$ is applied to the gate of the NMOS transistor N11, the NMOS transistor N11 is turned on. Further, with a logic low external signal $100_2$ applied to the gate of the NMOS transistor N12, the NMOS transistor N12 is turned off, and the node A becomes high. Further, high signals are applied to the gates of the NMOS transistors N14, N15 to turn on the NMOS transistors N14, N15. When a logic high external signal $100_3$ is applied to the gates of the NMOS transistor N12 and the PMOS transistor P13, the NMOS transistor N12 is turned on while the PMOS transistor P13 is turned off.

In the first preferred embodiment, the external signals $100_{1,2,3}$ are preferably pulse signals to reduce the standby current during operation of the sensing amplifier.

In the amplification unit 110, the channel W/L of the PMOS transistors P11, P12 varies based on an amount the input current is amplified. For example, to double the input current, the W/L of the PMOS transistor P12 is formed twice the size of the PMOS transistor P11.

The second current/voltage converter 200 performs substantially similar operations as the first current/voltage converter 100. The voltage comparator 300 compares and outputs the voltage difference between the node A and the node B as shown in FIG. 3.

The operation of the sense amplifier shown in FIG. 3 will further be described by an exemplary example (i.e., double amplification). When the input current is 20 $\mu$A, and the reference current is 10 $\mu$A, the current flowing to the PMOS transistor P11 is 20 $\mu$A. The current of 20 $\mu$A is amplified by the PMOS transistor P12 the channel W/L of which is two times the size of the PMOS transistor P11. The amplified current of 40 $\mu$A flows accordingly to the NMOS transistors N14, N15.

The power supply voltage $V_{cc}$ of 5 V is dropped by passing through the resistors R1, R2. For example, if the resistors R1, R2 both have a value of 30 k$\Omega$, respectively, the voltage drop is 30 k$\Omega \times 40$ $\mu$A=1.2 V in the first current/voltage converter 100. In the second current/voltage converter 200, the voltage drop is 30 k$\Omega \times 20$ $\mu$A=0.6 V. As a result, a voltage of 3.8 V is applied to the node A, and a voltage of 4.4 V is applied to the node B. Therefore, the voltage difference between the nodes A and B is 0.6 V for the sense amplifier in FIGS. 3.

The sense amplifier according to the present invention has advantages because the voltage difference between the first and second current/voltage converters can be increased, for example, two fold. Therefore, sensing is performed easier and the operating speed increases.

Figure 5:
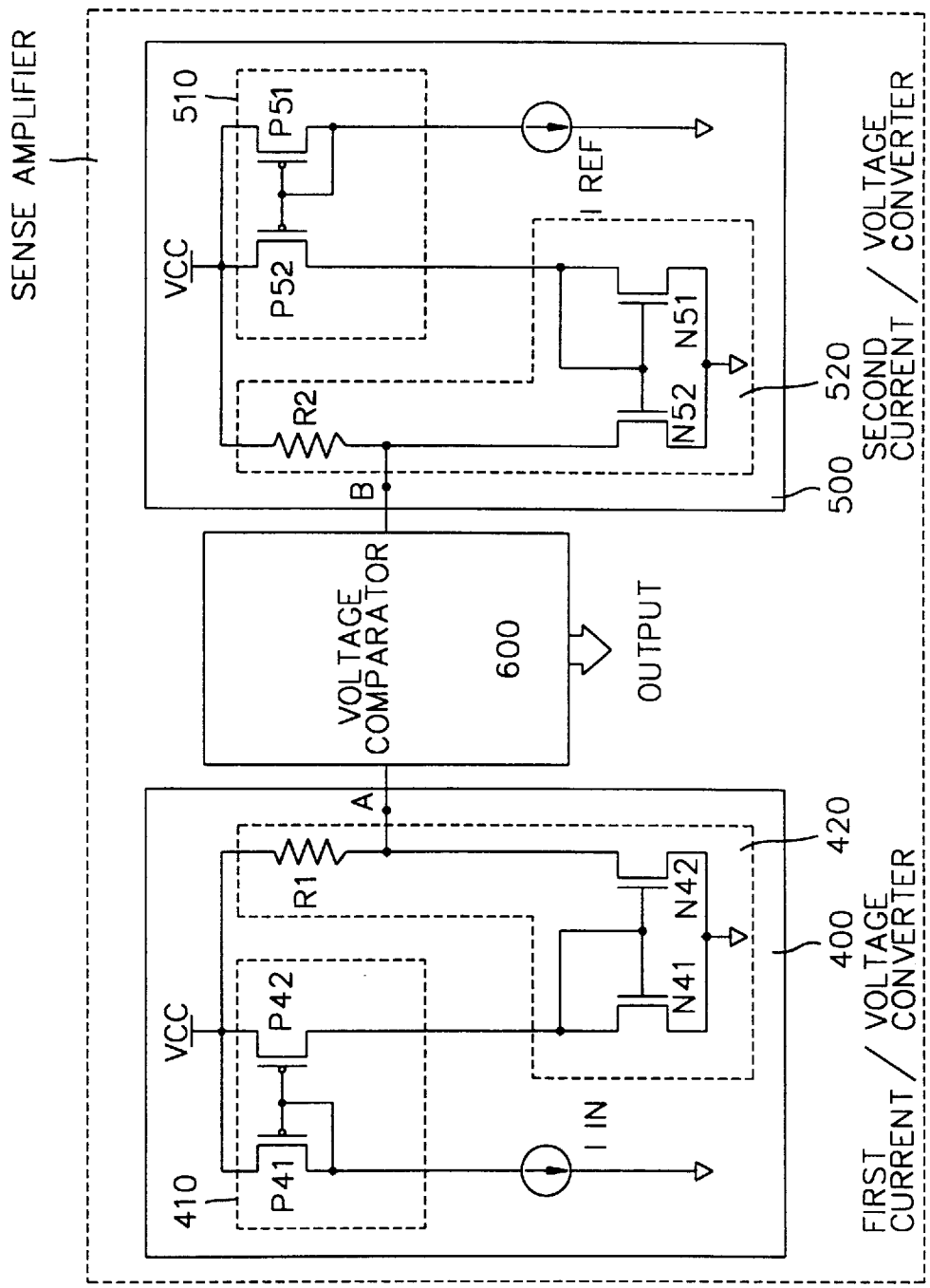
FIG. 5 is a diagram showing a circuit of another embodiment of a sense amplifier according to the present invention.

A second preferred embodiment of the sense amplifier will now be described with reference to FIG. 5. As portions of the configuration and operation are similar to the first preferred embodiment, a detailed description of those portions will be omitted here.

A first current/voltage converter 400 includes an amplification unit 410 to amplify a current from the memory cell (not illustrated) and a conversion unit 420 to convert the amplified current into a voltage.

In the amplification unit 410, the power supply voltage $V_{cc}$ is applied to the sources of PMOS transistors P41, P42, the gates of which are coupled to each other, the drain of the PMOS transistor P41 and a current source $I_{in}$. In the conversion unit 420, the gates of NMOS transistors N41, N42 are coupled to each other and the drain of an NMOS transistor N41. The sources of the NMOS transistors N41, N42 are coupled to ground. The resistor R1 coupled between the power supply voltage $V_{cc}$ and the drain of the NMOS transistor N42.

A second current/voltage converter 500 includes an amplification unit 510 to amplify a reference current received from an external current source transistor or the like (not illustrated) and a conversion unit 520 to convert the amplified reference current into a voltage.

In the amplification unit 510 of the second current/voltage converter 500, the power supply voltage $V_{cc}$ is applied to the sources of PMOS transistors P51, P52, the gates of which are coupled to each other, the drain of the PMOS transistor P51 and a current source $I_{REF}$. In the conversion unit 520, the gates of NMOS transistors N51, N52 are coupled to each other and the drain of the NMOS transistor N51. The sources of the NMOS transistors N51, N52 are coupled to ground. The resistor R2 of the conversion unit 520 is connected between the power supply voltage $V_{cc}$ and the drain of the NMOS transistor N52.

Figure 1:
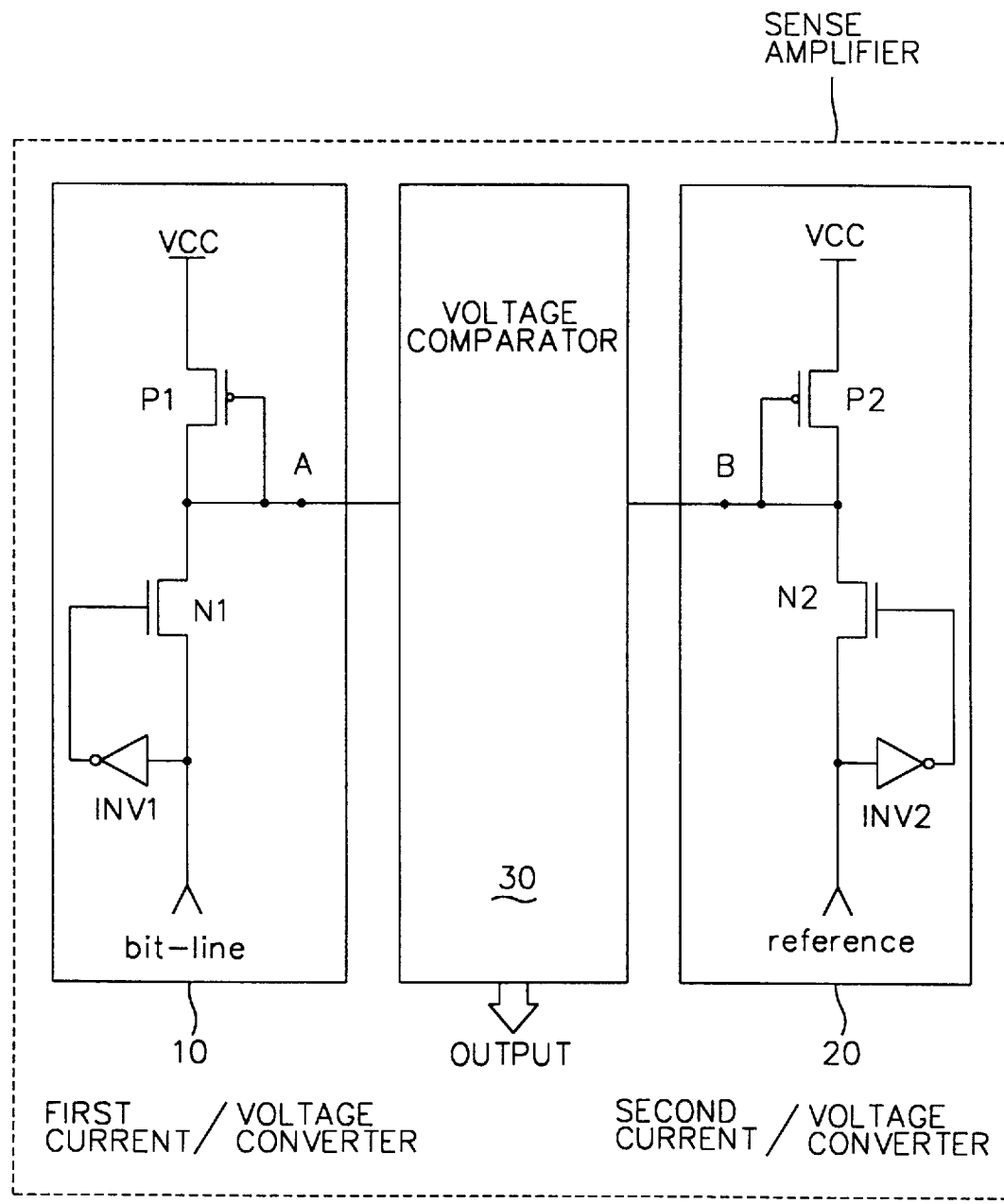
FIG. 1 is a diagram showing a circuit of a related art sense amplifier.
Figure 2:
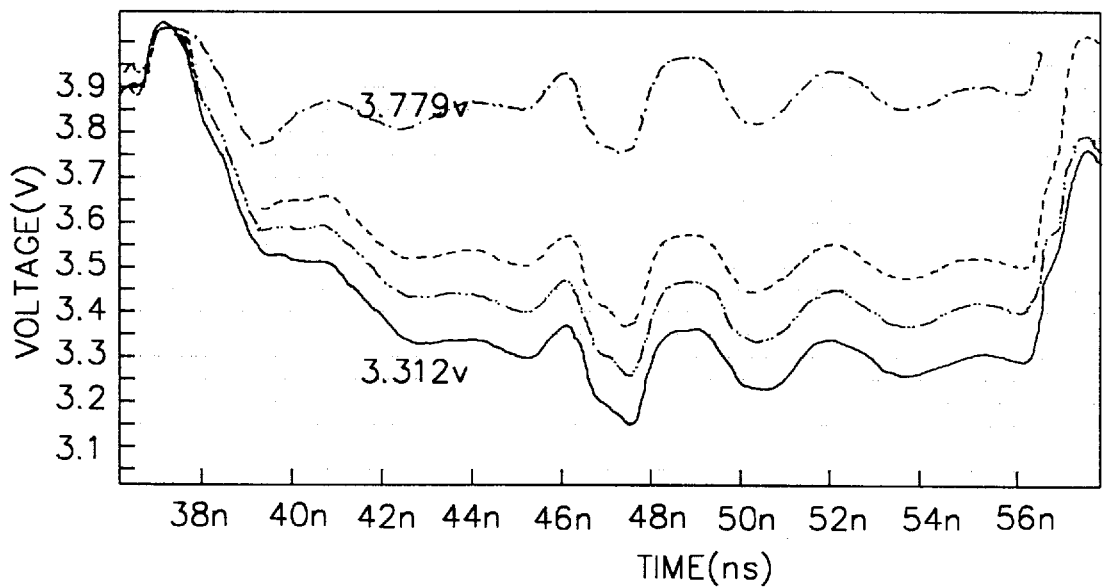
FIG. 2 is a diagram showing voltage over time at node A in FIG. 1.
Figure 4:
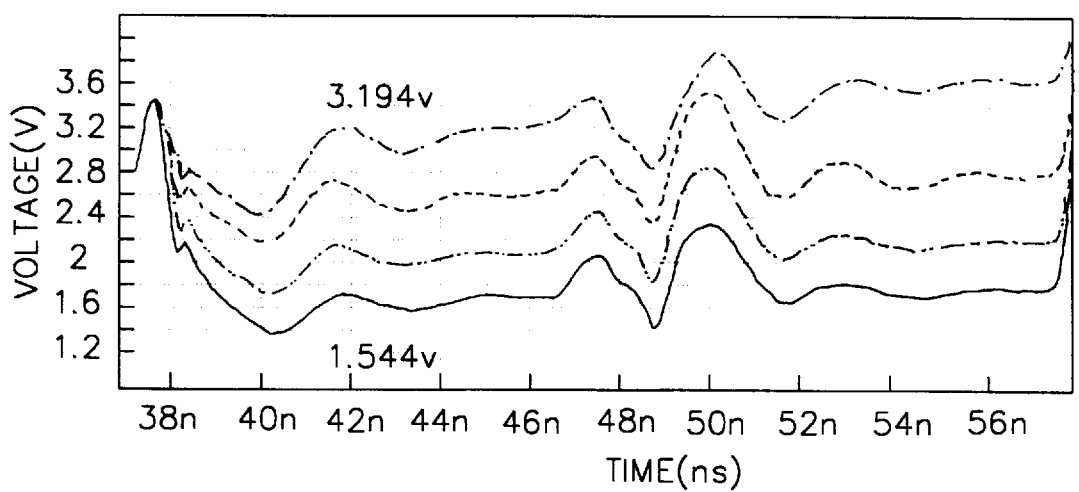
FIG. 4 is a diagram showing voltage over time at node A in FIG. 3.

FIG. 4 is a graph of changes in the voltage over time at the node A, which is the output point of the first current/voltage converter 400. As shown in FIG. 4, the difference between the threshold voltages 0.7 V (1.544 V) and 4 V (3.194 V) is more than three times larger than the related art voltage differences (0.467 V in FIG. 2). The difference in the amplified voltages improves the comparison in the voltage comparater. Further, a stable output from the sense amplifier is easy to obtain.

A multi bit memory cell generally requires cells having different threshold voltages. A corresponding multi bit memory cell sense amplifier is required to sense the current difference between the cells. However, the small current differences caused by the multibit memory threshold voltages are very difficult to sense using the related art sense amplifier.

In contrast, the sense amplifier according to the present invention amplifies the small current input through the bit line of the memory cell, and then converts the amplified current into a voltage. Thus, the sensing becomes easier relative to the related art sense amplifier by comparing the converted voltages.

The sense amplifier according to the present invention can further be used for a multi bit memory cell, which requires cells having different threshold voltages, to sense the current difference between the cells.

Further, sensing of only one bit per cell is possible with the related art sense amplifier. In contrast, the sense amplifier according to the present invention can sense two bits per cell, which makes possible a multi bit memory. Therefore, the area of the memory elements can be reduced by 40% or more relative to related art memory elements.

It is to be understood that both the foregoing general description and the following detailed description are exemplary and explanatory. It will be apparent to those skilled in the art that various modifications can be made in the current/voltage converter, sense amplifier and method of the present invention without departing from the spirit or scope of the invention. It is intended that the present invention cover the modifications and variations of this invention that are within the scope of the appended claims and their equivalents.

What is claimed is:

1. A current/voltage converter, comprising:
   an amplification circuit that amplifies an input current, wherein the amplification circuit comprises,
      a first conductivity type current mirror having an input terminal and an output that generates an amplified input current, and
      a first transistor having a source coupled to receive the input current, a drain coupled to the input terminal of the first current mirror and a gate coupled to receive an input pulse signal; and
   a conversion circuit that converts the amplified input current into a voltage, the conversion circuit including a second current mirror having a second conductivity type.

2. The current/voltage converter of claim 1, wherein the amplification circuit comprises:
   a current mirror including second and third transistors having sources coupled to receive a supply voltage and having gates coupled together and to a drain of the second transistor and wherein the current mirror is the first current mirror.

3. The current/voltage converter of claim 2, wherein the it pulse signal controls an operating time of the amplification circuit, wherein the first transistor is an NMOS transistor and the second and third transistors are PMOS transistors.

4. The current/voltage converter of claim 1, wherein the conversion circuit comprises:
   a sixth transistor having a source coupled to ground, a drain of which is coupled to receive the amplified input current from the amplification circuit and a gate coupled to receive a second pulse signal;
   wherein the second current mirror includes second and third transistors having respective sources coupled to ground, and respective gates commonly coupled to the drain of the sixth transistor and to a drain of the second transistor;
   a fourth transistor having a source coupled to a drain of the third transistor, a drain coupled to an output node of the current/voltage converter and a gate coupled to receive a third pulse signal;
   a fifth transistor having a source coupled to the drain of the fourth transistor, a drain coupled to the source of the second transistor and a gate coupled to the gate of the fourth transistor; and
   a resistor coupled in series between a supply voltage source and the drain of the fourth transistor.

5. The current/voltage converter of claim 4, wherein the second and third second pulse signals control an operating time of the conversion circuit, and wherein the second, third, fourth and sixth transistors are NMOS transistors and the fifth transistor is a PMOS transistor.

6. The current/voltage converter of claim 1, wherein the first current mirror comprises a pair of first conductivity type transistors having sources coupled to receive a supply voltage, gates commonly coupled to a drain of one of the pair of the first conductivity type transistors.

7. The current/voltage converter of claim 1, wherein the second current mirror comprises:

a pair of second conductivity type transistors having sources coupled to ground and gates coupled together and to a drain of one of the pair of second conductivity type transistors, wherein the drain of the one second conductivity type transistor is coupled to receive the amplified input current from the amplification circuit and a drain of the other second conductivity type transistor is coupled to an output node of the current/voltage converter; and a resistor coupled in series between a supply voltage source and the drain of the other second conductivity type transistor.

8. The current/voltage converter of claim 1, wherein the first conductivity type is p-type and the second conductivity type is n-type.

9. A sense amplifier, comprising:
   first and second current/voltage converters each including an amplification unit and a conversion unit, wherein the amplification unit includes a first current mirror that amplifies an input current and the conversion unit, which includes a second current mirror, that converts the amplified input current into a voltage; and
   a voltage comparator that compares the respective voltages converted by the first and second current/voltage converters.

10. The sense amplifier according to claim 9, wherein the first current mirror is a first conductivity type and the second current mirror is a second conductivity type.

11. The sense amplifier according to claim 10, wherein the first conductivity type is p-type and the second conductivity type is n-type.

12. The sense amplifier according to claim 9, wherein each amplification unit comprises:
   the first current mirror including first and second transistors having sources coupled to receive a supply voltage and having gates coupled together and to a drain of the first transistor; and
   a third transistor having a source coupled to receive the input current, a drain coupled to the drain of the first transistor and a gate coupled to receive a pulse signal.

13. The sense amplifier according to claim 12, wherein the pulse signal controls an operating time of the amplification unit.

14. The sense amplifier according to claim 9, wherein each conversion unit comprises:
   a first transistor having a source coupled to ground, a drain of which is coupled to receive the amplified input current from the amplification unit and a gate coupled to receive a first pulse signal;
   the second current mirror including second and third transistors having respective sources coupled to ground, and respective gates commonly coupled to the drain of the first transistor and to a drain of the second transistor;
   a fourth transistor having a source coupled to a drain of the third transistor, a drain coupled to an output node of the sense amplifier and a gate coupled to receive a second pulse signal;
   a fifth transistor having a source coupled to the drain of the fourth transistor, a drain coupled to the source of the second transistor and a gate coupled to the gate of the fourth transistor; and
   a resistor coupled in series between a supply voltage source and the drain of the fourth transistor.

15. The sense amplifier according to claim 14, wherein the first and second pulse signals control an operating time of the conversion unit.

16. The sense amplifier according to claim 9, wherein the first current mirror comprises a pair of first conductivity type transistors having sources coupled to receive a supply voltage, gates commonly coupled to a drain of one of the pair of the first conductivity type transistors and to the input current.

17. The sense amplifier according to claim 9, wherein the second current mirror comprises:

a pair of second conductivity type transistors having sources coupled to ground and gates coupled together and to a drain of one of the pair of second conductivity type transistors, wherein the drain of the one second conductivity type transistor is coupled to receive the amplified input current from the amplification unit and a drain of the other second conductivity type transistor is coupled to an output node of the sense amplifier; and a resistor coupled in series between a supply voltage source and the drain of the other second conductivity type transistor.

18. A method of operating a sense amplifier, comprising:

amplifying an input current to be sensed and a reference current with first and second current mirrors, respectively;

converting the amplified input current and the amplified reference current into respective first and second voltages;

comparing the first and second voltages for sensing a voltage difference between the first and second voltages; and controlling an operating time of the first and second current mirrors based on a first pulse signal applied thereto.

19. The method according to claim 18, wherein the converting step converts the first and second voltages using third and fourth current mirrors, respectively.

20. The method according to claim 19, wherein the first and second current mirrors are a first conductivity type and the third and fourth mirrors are a second conductivity type.

21. The method according to claim 20, wherein the first conductivity type is p-type and the second conductivity type is n-type.

22. The method according to claim 19, further comprising controlling an operating time of the third and fourth current mirrors based on second and third pulse signals respectively applied thereto.

23. A method of operating a sense amplifier, comprising:

amplifying an input current to be sensed and a reference current with first and second current mirrors, respectively;

converting the amplified input current and the amplified reference current into respective first and second voltages; and comparing the first and second voltages for sensing a voltage difference between the first and second voltages, wherein the converting step converts the first and second voltages using third and fourth current mirrors, respectively.

24. The method of claim 23, further comprising controlling an operating time of the first through fourth current mirrors based on pulse signals applied thereto.

* * * * *